(12) United States Patent
Takada

(10) Patent No.: US 9,948,302 B2
(45) Date of Patent: Apr. 17, 2018

(54) LEVEL SHIFT CIRCUIT

(71) Applicant: SII Semiconductor Corporation, Chiba-shi, Chiba (JP)

(72) Inventor: Kosuke Takada, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/463,605

(22) Filed: Mar. 20, 2017

(65) Prior Publication Data

US 2017/0279450 A1    Sep. 28, 2017

(30) Foreign Application Priority Data

Mar. 23, 2016  (JP) ................................. 2016-058853

(51) Int. Cl.
*H03L 5/00* (2006.01)
*H03K 19/0185* (2006.01)
*H03K 17/687* (2006.01)

(52) U.S. Cl.
CPC . *H03K 19/018507* (2013.01); *H03K 17/6871* (2013.01)

(58) Field of Classification Search
CPC .............................................. H03K 19/018507
USPC ............................................................... 327/333
See application file for complete search history.

(56) References Cited

U.S. PATENT DOCUMENTS

| 8,723,552 | B2* | 5/2014 | Tseng | ............. | H03K 19/018507 |
| | | | | | 323/282 |
| 9,350,352 | B2 | 5/2016 | Koike | | |
| 2013/0229207 | A1* | 9/2013 | Tseng | ............... | H03K 19/00361 |
| | | | | | 327/109 |
| 2014/0320180 | A1* | 10/2014 | Akahane | ................. | H03K 7/08 |
| | | | | | 327/143 |

* cited by examiner

*Primary Examiner* — Lincoln Donovan
*Assistant Examiner* — Metasebia Retebo
(74) *Attorney, Agent, or Firm* — Brinks Gilson & Lione

(57) ABSTRACT

Provided is a level shift circuit capable of avoiding breakdown due to level shift operation. The level shift circuit includes: a floating power supply having one end connected to an output terminal; a circuit configured to receive a voltage of the floating power supply, a voltage of a low level power supply and first and second pulse signals from a pulse generating circuit, thereof to output first and second signals; and a logic circuit configured to receive first and second signals, thereby converting a signal that is input to the pulse generating circuit into a signal that fluctuates between a voltage at the one end of the floating power supply and a voltage at the other end thereof to output the converted signal.

2 Claims, 4 Drawing Sheets

LEVEL SHIFT CIRCUIT

RELATED APPLICATIONS

This application claims priority under 35 U.S.C. §119 to Japanese Patent Application No. 2016-058853 filed on Mar. 23, 2016, the entire content of which is hereby incorporated by reference.

BACKGROUND OF THE INVENTION

1. Field of the Invention

The present invention relates to a level shift circuit.

2. Description of the Related Art

FIG. 3 is a circuit diagram for illustrating a related-art level shift circuit 300.

The related-art level shift circuit 300 includes a high level power supply terminal 301, an output terminal 302, a ground terminal 303, a floating power supply 304, a low level power supply 305, a PWM terminal 306, a pulse generating circuit 311, resistors 316 and 317, high withstand voltage NMOS transistors 314, 315, 323, and 324, a logic circuit 310 including inverter circuits 318 and 319 and an RS flip-flop circuit 320, driver circuits 321 and 322, and a low-side drive signal input terminal 307.

Connection in the related-art level shift circuit 300 is described with reference to FIG. 3.

The pulse generating circuit 311 has an input connected to the PWM terminal 306. The high withstand voltage NMOS transistor 314 has a gate connected to a first output of the pulse generating circuit 311, a source connected to the ground terminal 303, and a drain connected to one end of the resistor 316 and an input of the inverter circuit 318. The high withstand voltage NMOS transistor 315 has a gate connected to a second output of the pulse generating circuit 311, a source connected to the ground terminal 303, and a drain connected to one end of the resistor 317 and an input of the inverter circuit 319.

The RS flip-flop circuit 320 has a set terminal S connected to an output of the inverter circuit 318, a reset terminal R connected to an output of the inverter circuit 319, and an output terminal Q connected to an input of the driver circuit 321.

The driver circuit 321 has an output connected to a gate of the high withstand voltage NMOS transistor 323. The high withstand voltage NMOS transistor 323 has a source connected to the output terminal 302, and a drain connected to the high level power supply terminal 301.

The floating power supply 304 has one end connected to the other end of the resistor 316, the other end of the resistor 317, and a power supply input of the driver circuit 321, and the other end connected to the output terminal 302 and a low level power supply input of the driver circuit 321. The driver circuit 322 has an input connected to the low-side drive signal input terminal 307, a power supply input connected to one end of the low level power supply 305, and a low level power supply input connected to the ground terminal 303. The high withstand voltage NMOS transistor 324 has a gate connected to an output of the driver circuit 322, a source connected to the ground terminal 303, and a drain connected to the output terminal 302. The low level power supply 305 has the other end connected to the ground terminal 303.

Operation of the related-art level shift circuit 300 is described.

First, how the related-art level shift circuit 300 operates when a rising edge appears in a PWM signal is described.

Here, the PWM signal is a signal having an amplitude equal to that of the voltage of the low level power supply 305.

The pulse generating circuit 311 receives a PWM signal, and outputs, at timing of the rising edge of the PWM signal, a one-shot pulse to the gate of the high withstand voltage NMOS transistor 314 as a first output signal S1. The high withstand voltage NMOS transistor 314 converts the one-shot pulse being the signal S1 into a current, and supplies the current to the resistor 316. In this way, a voltage HV1 is generated at the one end of the resistor 316.

The inverter circuit 318 supplies an inverted signal S2 of the voltage HV1 to the set terminal S of the RS flip-flop circuit 320. The RS flip-flop circuit 320 is set through this operation, and outputs a HIGH level from the output terminal Q as an output signal Q0. The logic circuit 310 operates with the floating power supply 304 as illustrated in FIG. 3.

The driver circuit 321 buffers the signal Q0 being the HIGH level input thereto, and drives the high withstand voltage NMOS transistor 323 by an output signal DRV. As a result, the high withstand voltage NMOS transistor 323 is turned on, and an output voltage OUT at the output terminal 302 rises. The low-side drive signal input terminal 307, to which a signal for alternately turning on and off the high withstand voltage NMOS transistors 323 and 324 is input, receives a LOW level in this case where the signal Q0 is the HIGH level. That is, the high withstand voltage NMOS transistor 324 is turned off.

Next, how the related-art level shift circuit 300 operates when a falling edge appears in a PWM signal is described, subsequently to the above-mentioned operation.

The pulse generating circuit 311 receives a PWM signal, and outputs, at timing of the falling edge of the PWM signal, a one-shot pulse to the gate of the high withstand voltage NMOS transistor 315 as a second output signal R1. The high withstand voltage NMOS transistor 315 converts the one-shot pulse being the signal R1 into a current, and supplies the current to the resistor 317. In this way, a voltage HV2 is generated at the one end of the resistor 317.

The inverter circuit 319 outputs an inverted signal R2 of the voltage HV2 to the reset terminal R of the RS flip-flop circuit 320. The RS flip-flop circuit 320 is reset through this operation, and outputs the LOW level from the output terminal Q as the output signal Q0.

The driver circuit 321 buffers the LOW level input thereto, and turns off the high withstand voltage NMOS transistor 323. The HIGH level is input to the low-side drive signal input terminal 307 after the high withstand voltage NMOS transistor 323 is turned off. That is, the high withstand voltage NMOS transistor 324 is turned on after the high withstand voltage NMOS transistor 323 is turned off. As a result of this operation, the output voltage OUT at the output terminal 302 drops.

In this manner, a PWM signal having an amplitude equal to that of the voltage of the low level power supply 305 is converted (level shifted) into a signal having an amplitude equal to that of the voltage of the floating power supply 304, and is then output from the output terminal Q of the logic circuit 310 as the output signal Q0.

The high withstand voltage NMOS transistor 323 is driven by the output signal Q0, and as a result, the output voltage OUT having an amplitude between those at the high level power supply terminal 301 and the ground terminal 303 is obtained.

A level shift circuit having a configuration similar to that of the level shift circuit 300 is described in Japanese Patent Application Laid-open No. 2011-109843, for example.

FIG. 4 is an illustration of voltage waveforms corresponding to voltages at respective nodes of the related-art level shift circuit 300.

As illustrated in FIG. 4, the PWM signal shifts from the LOW level to the HIGH level at time t0, and the output voltage OUT rises from time t0 to time t1. It can been seen that in a period T in which the output voltage OUT rises, rise of the output voltage OUT propagates as described above, and a spike noise N is generated in each of the first and second output signals S1 and R1 of the pulse generating circuit 311, resulting in voltage fluctuation. In particular, addition of the noise N to the one-shot pulse being the output signal S1 leads to a fear that a voltage higher than the highest voltage of the one-shot pulse propagates to the pulse generating circuit 311.

SUMMARY OF THE INVENTION

The present invention has been made in order to solve the problems described above.

According to one embodiment of the present invention, there is provided a level shift circuit, including: an input terminal to which an input signal that fluctuates between a reference voltage and a first voltage is supplied; an output terminal for outputting an output voltage corresponding to the input signal; a floating power supply including one end connected to the output terminal; a fixed power supply, which includes one end connected to the reference voltage, and is configured to generate a second voltage at another end of the fixed power supply; a first resistor and a second resistor each including one end connected to another end of the floating power supply; a first NMOS transistor and a second NMOS transistor including drains connected to another ends of the first resistor and the second resistor, respectively; a third resistor and a fourth resistor including one ends connected to sources of the first NMOS transistor and the second NMOS transistor, respectively; a third NMOS transistor and a fourth NMOS transistor including drains connected to another ends of the third resistor and the fourth resistor, respectively, and sources connected to the reference voltage; a pulse generating circuit configured to output a first pulse signal and a second pulse signal for turning on and off the third NMOS transistor and the fourth NMOS transistor, respectively, based on the input signal; and a logic circuit configured to operate with the floating power supply, and receive a first signal and a second signal that are generated at the another ends of the first resistor and the second resistor, respectively, thereby converting the input signal into a signal that fluctuates between a voltage at the one end of the floating power supply and a voltage at the another end of the floating power supply to output the converted signal, the first NMOS transistor and the second NMOS transistor including gates connected to the second voltage, the first NMOS transistor being configured to operate such that a drain voltage of the third NMOS transistor is prevented from exceeding a withstand voltage of the third NMOS transistor when the third NMOS transistor is turned on, the second NMOS transistor being configured to operate such that a drain voltage of the fourth NMOS transistor is prevented from exceeding a withstand voltage of the fourth NMOS transistor when the fourth NMOS transistor is turned on.

According to the level shift circuit of the present invention, even when fluctuations in output voltage, which occur when the output voltage rises, propagate via the floating power supply and the first and second resistors, the fluctuations are bypassed to the fixed power supply via the gate-drain capacitances of the first and second NMOS transistors. As a result, the fluctuation in output voltage is prevented from propagating to the pulse generating circuit, and it is thus possible to avoid the breakdown of the pulse generating circuit.

DETAILED DESCRIPTION OF THE PREFERRED EMBODIMENTS

Figure 1:
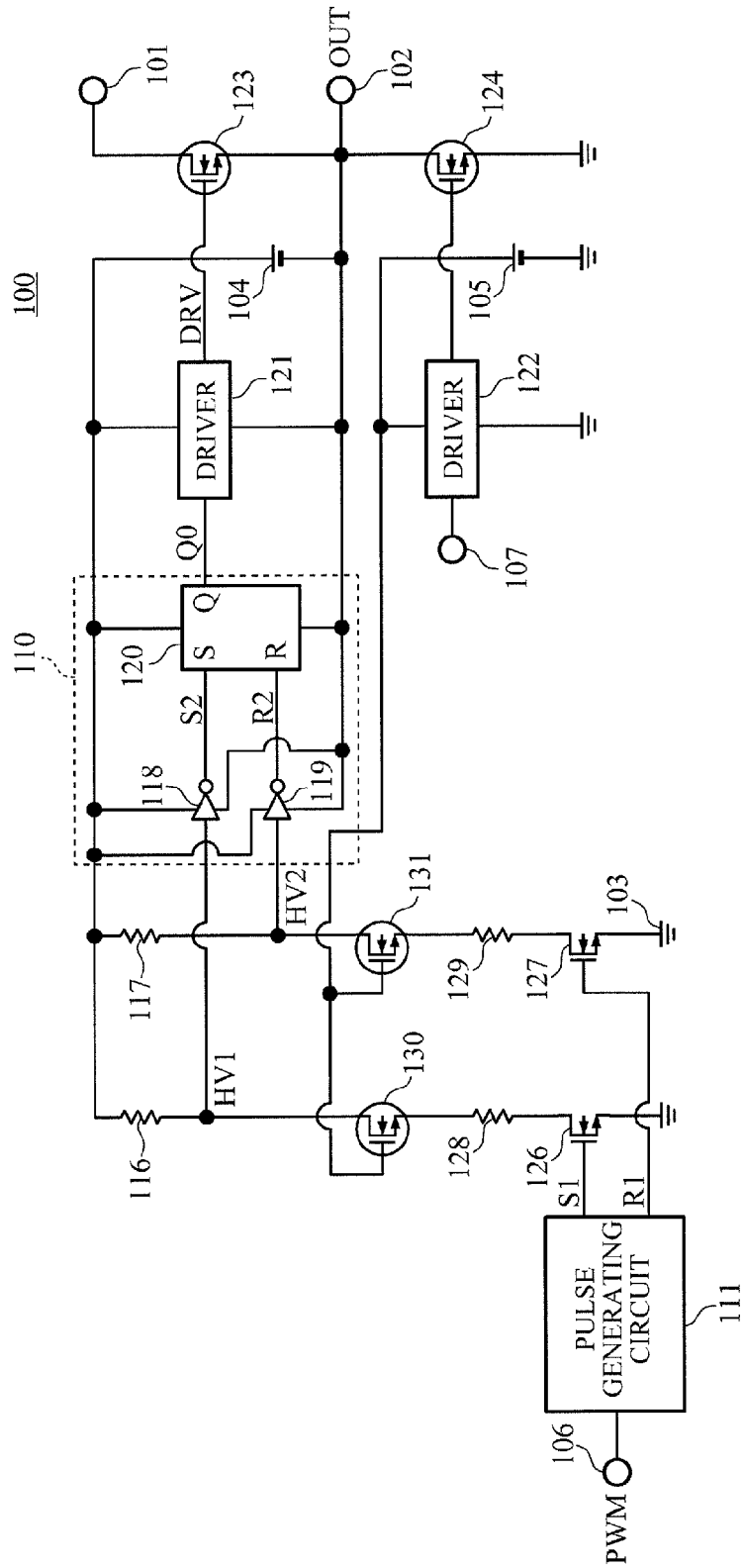
FIG. 1 is a circuit diagram for illustrating a level shift circuit according to a first embodiment of the present invention.

FIG. 1 is a circuit diagram for illustrating a level shift circuit 100 according to a first embodiment of the present invention.

As illustrated in FIG. 1, the level shift circuit 100 of this embodiment includes a high level power supply terminal 101, an output terminal 102, a ground terminal 103, a floating power supply 104, a low level power supply 105, a PWM terminal 106, a pulse generating circuit 111, resistors 128, 129, 116, and 117, high withstand voltage NMOS transistors 130, 131, 123, and 124, a logic circuit 110 including inverter circuits 118 and 119 and an RS flip-flop circuit 120, driver circuits 121 and 122, a low-side drive signal input terminal 107, and low withstand voltage NMOS transistors 126 and 127.

The pulse generating circuit 111 has an input connected to the PWM terminal 106. The low withstand voltage NMOS transistor 126 has a gate connected to a first output of the pulse generating circuit 111, a source connected to the ground terminal 103, and a drain connected to one end of the resistor 128. The low withstand voltage NMOS transistor 127 has a gate connected to a second output of the pulse generating circuit 111, a source connected to the ground terminal 103, and a drain connected to one end of the resistor 129.

The high withstand voltage NMOS transistor 130 has a gate connected to one end of the low level power supply 105, a source connected to the other end of the resistor 128, and a drain connected to one end of the resistor 116 and an input of the inverter circuit 118. The high withstand voltage NMOS transistor 131 has a gate connected to the one end of the low level power supply 105, a source connected to the other end of the resistor 129, and a drain connected to one end of the resistor 117 and an input of the inverter circuit 119.

The RS flip-flop circuit 120 has a set terminal S connected to an output of the inverter circuit 118, a reset terminal R connected to an output of the inverter circuit 119, and an output terminal Q connected to an input of the driver circuit 121. The driver circuit 121 has an output connected to a gate of the high withstand voltage NMOS transistor 123. The high withstand voltage NMOS transistor 123 has a source connected to the output terminal 102, and a drain connected to the high level power supply terminal 101.

The floating power supply 104 has one end connected to the other end of the resistor 116 and the other end of the resistor 117, and the other end connected to the output terminal 102. The driver circuit 122 has an input connected to the low-side drive signal input terminal 107. The high withstand voltage NMOS transistor 124 has a gate connected to an output of the driver circuit 122, a source connected to the ground terminal 103, and a drain connected to the output terminal 102. The low level power supply 105 has the other end connected to the ground terminal 103.

The logic circuit 110 and the driver circuit 121 each have a power supply input connected to the one end of the floating power supply 104, and a low level power supply input connected to the other end of the floating power supply 104. That is, the logic circuit 110 and the driver circuit 121 operate with the floating power supply 104. Meanwhile, the driver circuit 122 has a power supply input connected to the one end of the low level power supply 105, and a low level power supply input connected to the ground terminal 103. That is, the driver circuit 122 operates with the low level power supply 105.

In this embodiment, a PWM signal that is input to the PWM terminal 106 is a signal having an amplitude equal to that of the voltage of the low level power supply 105.

Now, operation of the level shift circuit 100 of this embodiment is described in detail.

First, how the level shift circuit 100 operates when a rising edge appears in a PWM signal is described.

The pulse generating circuit 111 receives a PWM signal, and outputs, at timing of the rising edge of the PWM signal, a one-shot pulse to the gate of the low withstand voltage NMOS transistor 126 as a first output signal S1. The low withstand voltage NMOS transistor 126 is thus turned on to decrease a drain voltage thereof to 0 V, and the one-shot pulse being the signal S1 is converted into a current by the resistor 128 and the high withstand voltage NMOS transistor 130 connected in series to the drain of the low withstand voltage NMOS transistor 126. The current is supplied to the resistor 116 to generate a voltage HV1 at the one end of the resistor 116. At this time, the high withstand voltage NMOS transistor 130 operates such that a source voltage thereof is clamped to a value lower than the voltage of the low level power supply 105 by the threshold of the high withstand voltage NMOS transistor 130. Through this clamp operation, the drain voltage of the low withstand voltage NMOS transistor 126 is prevented from exceeding the withstand voltage of the low withstand voltage NMOS transistor 126.

The inverter circuit 118 supplies an inverted signal S2 of the voltage HV1 to the set terminal S of the RS flip-flop circuit 120. The RS flip-flop circuit 120 is set through this operation, and outputs a HIGH level from the output terminal Q as an output signal Q0.

The driver circuit 121 buffers the signal Q0 being the HIGH level input thereto, and drives the high withstand voltage NMOS transistor 123 by an output signal DRV. As a result, the high withstand voltage NMOS transistor 123 is turned on, and an output voltage OUT at the output terminal 102 rises. The low-side drive signal input terminal 107, to which a signal for alternately turning on and off the high withstand voltage NMOS transistors 123 and 124 is input, receives a LOW level in this case where the signal Q0 is the HIGH level. That is, the high withstand voltage NMOS transistor 124 is turned off.

Next, how the level shift circuit 100 operates when a falling edge appears in a PWM signal is described, subsequently to the above-mentioned operation.

The pulse generating circuit 111 receives a PWM signal, and outputs, at timing of the falling edge of the PWM signal, a one-shot pulse to the gate of the low withstand voltage NMOS transistor 127 as a second output signal R1. The low withstand voltage NMOS transistor 127 is thus turned on to decrease a drain voltage thereof to 0 V, and the one-shot pulse being the signal R1 is converted into a current by the resistor 129 and the high withstand voltage NMOS transistor 131 connected in series to the drain of the low withstand voltage NMOS transistor 127. The current is supplied to the resistor 117 to generate a voltage HV2 at the one end of the resistor 117. At this time, the high withstand voltage NMOS transistor 131 operates such that a source voltage thereof is clamped to a value lower than the voltage of the low level power supply 105 by the threshold of the high withstand voltage NMOS transistor 131. Through this clamp operation, the drain voltage of the low withstand voltage NMOS transistor 127 is prevented from exceeding the withstand voltage of the low withstand voltage NMOS transistor 127.

The inverter circuit 119 outputs an inverted signal R2 of the voltage HV2 to the reset terminal R of the RS flip-flop circuit 120. The RS flip-flop circuit 120 is reset through this operation, and outputs the LOW level from the output terminal Q as the output signal Q0.

The driver circuit 121 buffers the LOW level signal Q0 input thereto, and turns off the high withstand voltage NMOS transistor 123. Meanwhile, the HIGH level is input to the low-side drive signal input terminal 107 after the high withstand voltage NMOS transistor 123 is turned off. That is, the high withstand voltage NMOS transistor 124 is turned on after the high withstand voltage NMOS transistor 123 is turned off. As a result of this operation, the output voltage OUT at the output terminal 102 drops.

In this manner, a PWM signal having an amplitude equal to that of the voltage of the low level power supply 105, that is, a signal that fluctuates between a ground voltage (also referred to as "reference voltage") and a voltage at the one end of the low level power supply 105, is converted (level shifted) into a signal having an amplitude equal to that of the voltage of the floating power supply 104, that is, a signal that fluctuates between a voltage at the one end of the floating power supply 104 and a voltage at the other end thereof. The converted signal is output from the output terminal Q of the logic circuit 110 as the output signal Q0.

The high withstand voltage NMOS transistor 123 is driven by the output signal Q0, and as a result, the output voltage OUT having an amplitude between those at the high level power supply terminal 101 and the ground terminal 103 is obtained.

As described above, in the level shift circuit 100 of this embodiment, the gates of the high withstand voltage NMOS transistors 130 and 131 are connected to the low level power supply 105, and hence voltage fluctuations in output voltage OUT that have propagated to the drains of the high withstand voltage NMOS transistors 130 and 131 are bypassed to the low level power supply 105 via the gate-drain capacitances of the high withstand voltage NMOS transistors 130 and 131, respectively. This suppresses voltage fluctuations in first and second output signals S1 and R1 of the pulse generating circuit, which occur in the related-art level shift circuit 300 in the period in which the output voltage OUT rises. It is consequently possible to prevent the breakdown of the pulse generating circuit 111.

Figure 2:
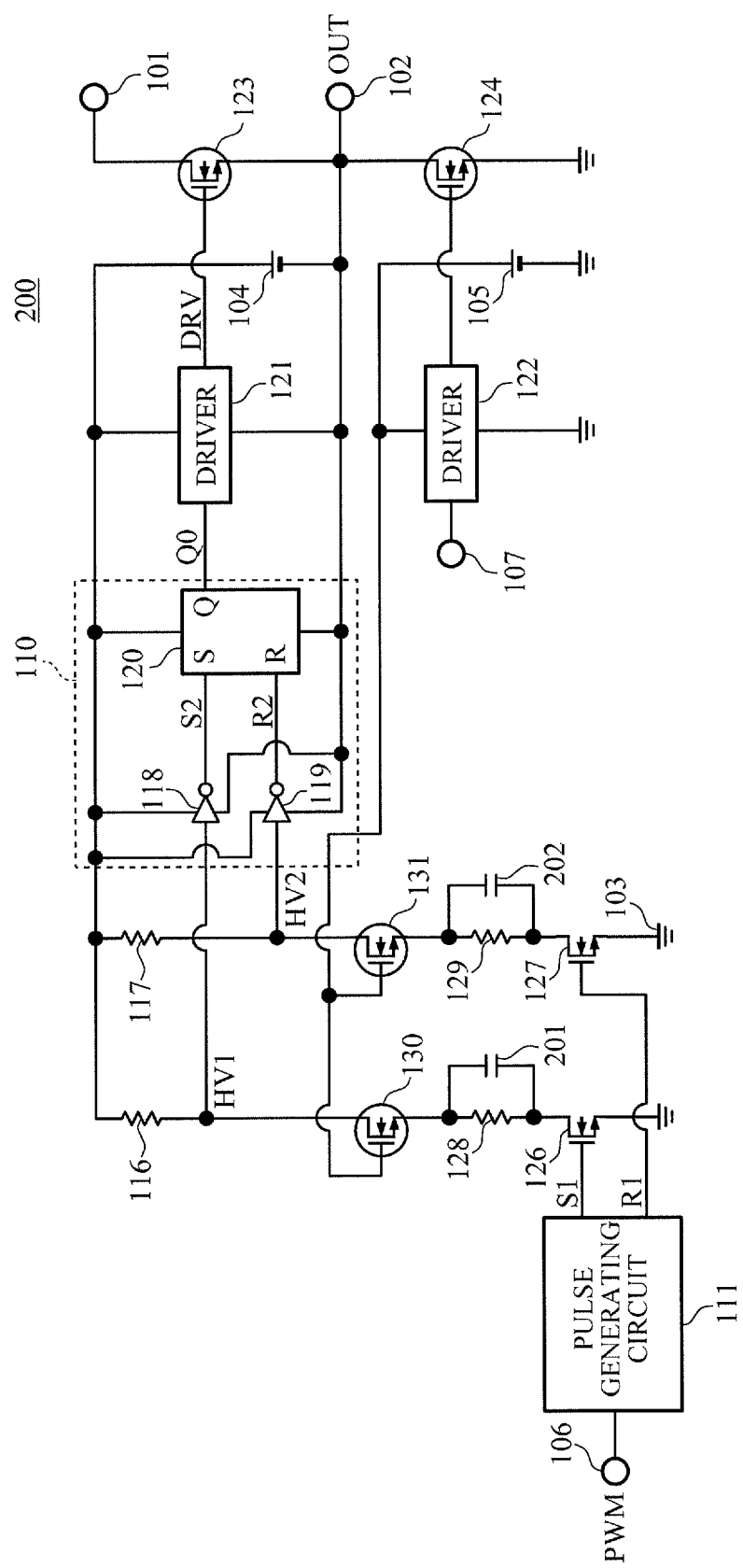
FIG. 2 is a circuit diagram for illustrating a level shift circuit according to a second embodiment of the present invention.
Figure 3:
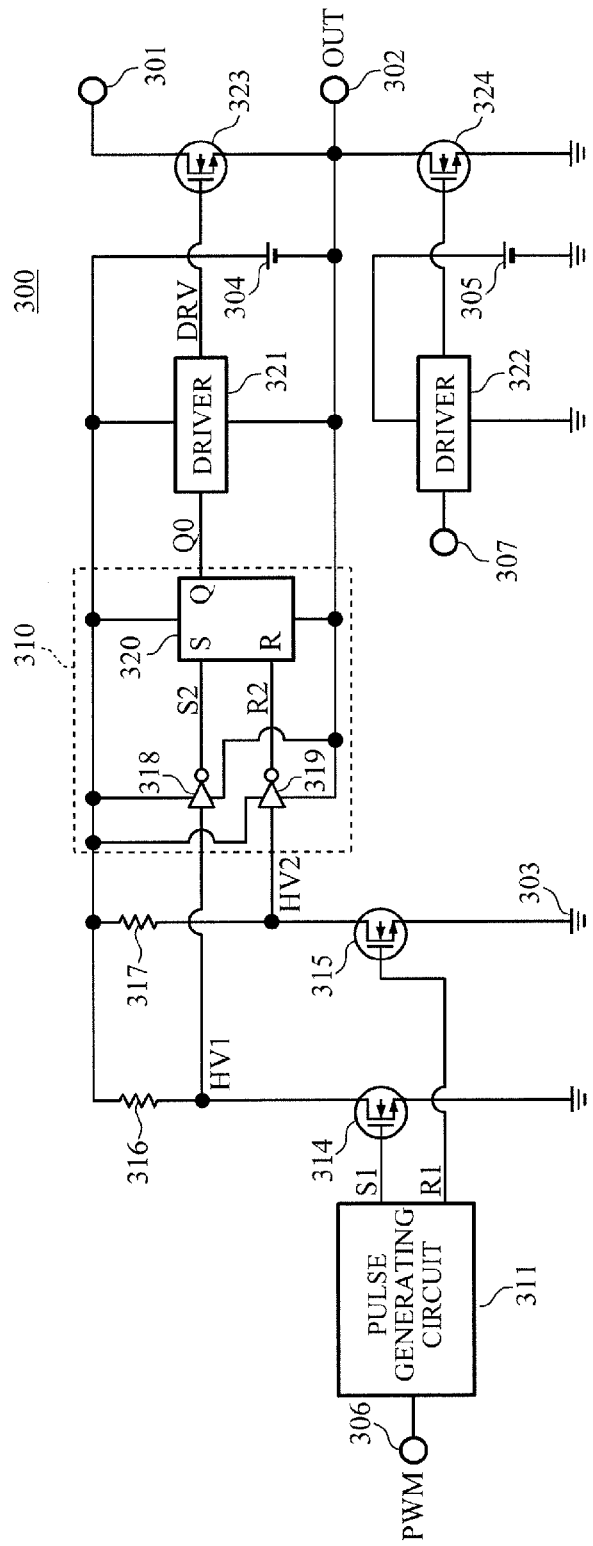
FIG. 3 is a circuit diagram of a related-art level shift circuit.
Figure 4:
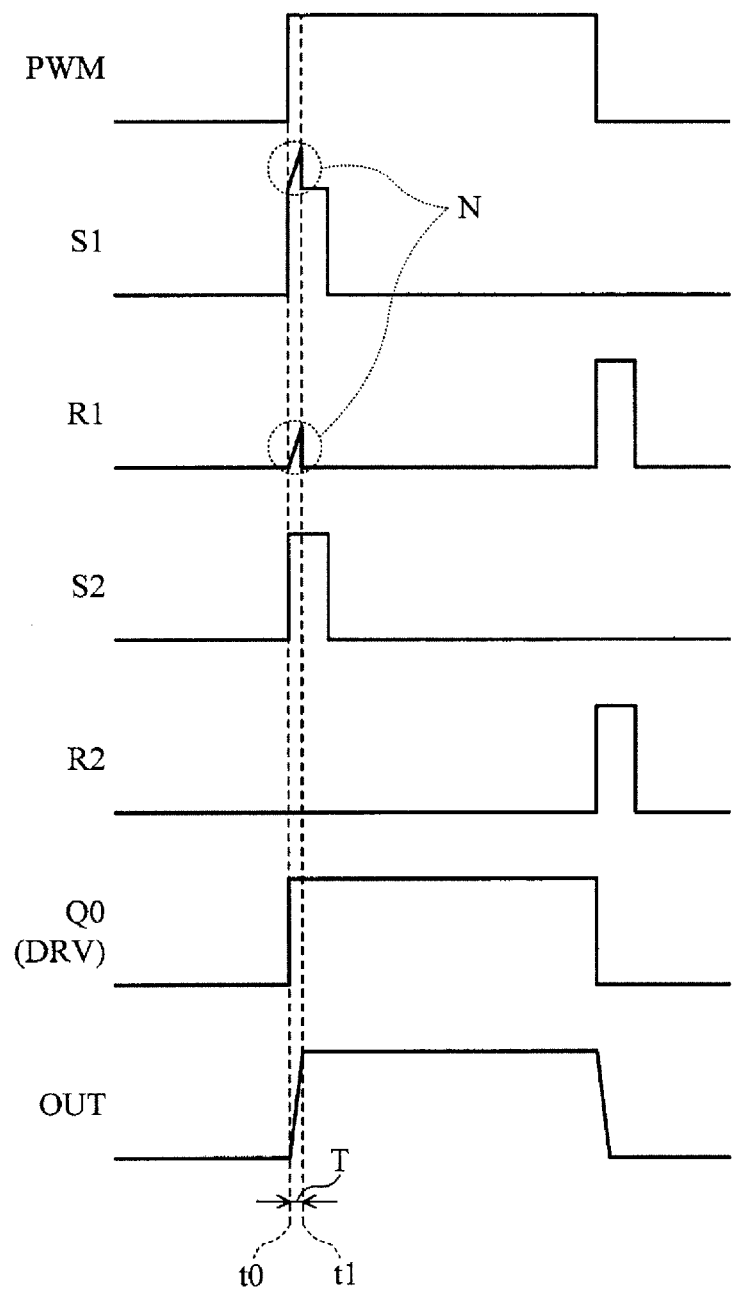
FIG. 4 is a diagram for describing a problem of the related-art level shift circuit.

FIG. 2 is a circuit diagram for illustrating a level shift circuit 200 according to a second embodiment of the present invention.

The level shift circuit 200 of FIG. 2 includes capacitors 201 and 202 connected in parallel to the resistors 128 and 129, respectively, in the level shift circuit 100 of FIG. 1. The remaining configuration is the same as that of the level shift circuit 100 illustrated in FIG. 1. The same components are denoted by the same reference symbols and redundant description is omitted.

The capacitor 201 is capable of generating a large current relative to the resistor 128 to discharge charges in a node at the one end of the resistor 116 at high speed when the low withstand voltage NMOS transistor 126 is turned on. Further, the capacitor 202 is capable of providing the same effect to a node at the one end of the resistor 117.

In conclusion, according to this embodiment, not only the same effect as the one provided by the above-mentioned first embodiment can be provided, but also the level shift operation can be performed at a higher speed by virtue of the capacitors 201 and 202.

The embodiments of the present invention have been described above, but the present invention is not limited to the above-mentioned embodiments, and it is understood that various modifications can be made thereto without departing from the gist of the present invention.

For example, in the examples of the above-mentioned embodiments, a PWM signal that is input to the PWM terminal 106 is a signal having an amplitude equal to that of the voltage of the low level power supply 105, but the PWM signal may be a signal having an amplitude different from that of the voltage of the low level power supply 105.

What is claimed is:

1. A level shift circuit, comprising:
   an input terminal to which an input signal that fluctuates between a reference voltage and a first voltage is supplied;
   an output terminal for outputting an output voltage corresponding to the input signal;
   a floating power supply including one end connected to the output terminal;
   a fixed power supply, which includes one end connected to the reference voltage, and is configured to generate a second voltage at another end of the fixed power supply;
   a first resistor and a second resistor each including one end connected to another end of the floating power supply;
   a first NMOS transistor and a second NMOS transistor including drains connected to another ends of the first resistor and the second resistor, respectively;
   a third resistor and a fourth resistor including one ends connected to sources of the first NMOS transistor and the second NMOS transistor, respectively;
   a third NMOS transistor and a fourth NMOS transistor including drains connected to another ends of the third resistor and the fourth resistor, respectively, and sources connected to the reference voltage;
   a pulse generating circuit configured to output a first pulse signal and a second pulse signal for turning on and off the third NMOS transistor and the fourth NMOS transistor, respectively, based on the input signal; and
   a logic circuit configured to operate with the floating power supply, and receive a first signal and a second signal that are generated at the another ends of the first resistor and the second resistor, respectively, thereby converting the input signal into a signal that fluctuates between a voltage at the one end of the floating power supply and a voltage at the another end of the floating power supply to output the converted signal,
   the first NMOS transistor and the second NMOS transistor including gates connected to the second voltage,
   the first NMOS transistor being configured to operate such that a drain voltage of the third NMOS transistor is prevented from exceeding a withstand voltage of the third NMOS transistor when the third NMOS transistor is turned on,
   the second NMOS transistor being configured to operate such that a drain voltage of the fourth NMOS transistor is prevented from exceeding a withstand voltage of the fourth NMOS transistor when the fourth NMOS transistor is turned on.

2. A level shift circuit according to claim 1, further comprising a first capacitor and a second capacitor connected in parallel to the third resistor and the fourth resistor, respectively.

* * * * *